(12) United States Patent  
Jeon et al.

(10) Patent No.: US 10,811,471 B2  
(45) Date of Patent: Oct. 20, 2020

(54) OLED DISPLAY APPARATUS WITH REDUCED BEZEL

(71) Applicant: SAMSUNG DISPLAY CO., LTD., Yongin-si, Gyeonggi-Do (KR)

(72) Inventors: Myoung-ha Jeon, Asan-si (KR); Hyeonjeong Oh, Yeosu-si (KR); Kichang Lee, Gwacheon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/270,130

(22) Filed: Feb. 7, 2019

(65) Prior Publication Data

US 2019/0259818 A1 Aug. 22, 2019

(30) Foreign Application Priority Data

Feb. 21, 2018 (KR) .................. 10-2018-0020720

(51) Int. Cl.  
*G06F 3/044* (2006.01)  
*H01L 27/32* (2006.01)  
(Continued)

(52) U.S. Cl.  
CPC ............ *H01L 27/323* (2013.01); *G06F 3/044* (2013.01); *G06F 3/0412* (2013.01);  
(Continued)

(58) Field of Classification Search  
CPC ............. G06F 1/16; G06F 2203/04102; G06F 1/1643; G06F 1/1616; G06F 1/1658;  
(Continued)

(56) References Cited

U.S. PATENT DOCUMENTS 9,780,157 B2  10/2017  Kwon et al.  
9,798,414 B2  10/2017  Kim et al.  
(Continued)

FOREIGN PATENT DOCUMENTS

EP  3 139 207  3/2017  
KR  1020160061563  6/2016  
(Continued)

OTHER PUBLICATIONS

Extended European Search Report dated Jun. 13, 2019 for Application No. 19158481.2.

*Primary Examiner* — Duc Q Dinh  
(74) *Attorney, Agent, or Firm* — F. Chau & Associates, LLC

(57) ABSTRACT

A display apparatus includes a touch screen panel having an active area and a non-active area. The touch screen panel includes a first side and a second side. A display flexible printed circuit board is connected to the touch screen panel. The display flexible printed circuit board at least partially overlaps the first side of the touch screen panel. A touch flexible printed circuit board is connected to the touch screen panel. The touch flexible printed circuit board at least partially overlaps the second side of the touch screen panel. The touch flexible printed circuit board is bent toward a lower surface of the touch screen panel. A reinforcement member contacts a lower surface of the touch flexible printed circuit board. A portion of a side surface of the touch screen panel is connected to the second side of the touch screen panel.

20 Claims, 11 Drawing Sheets

(51) Int. Cl.
*G06F 3/041* (2006.01)
*H01L 51/00* (2006.01)
*H01L 51/52* (2006.01)
*H05K 1/02* (2006.01)

(52) U.S. Cl.
CPC ...... *H01L 27/3244* (2013.01); *H01L 51/0097* (2013.01); *H01L 51/5253* (2013.01); *H05K 1/0281* (2013.01); *G06F 2203/04102* (2013.01); *G06F 2203/04103* (2013.01); *H01L 2251/5338* (2013.01)

(58) Field of Classification Search
CPC .. G06F 1/1652; G06F 1/1637; G06F 17/5081; G06F 2203/04103; G06F 1/1684; G06F 1/183; H05K 1/147; H05K 2201/10151; H05K 1/0281; H05K 1/189; H05K 5/0017; H05K 1/18; H05K 2201/2009; H05K 2201/2036; H05K 1/0271; H05K 1/144; H05K 3/284; H05K 1/028; H05K 1/11; H05K 2201/041
See application file for complete search history.

(56) References Cited

U.S. PATENT DOCUMENTS

| | | | |
|---|---|---|---|
| 2013/0056243 A1* | 3/2013 | Kim | H05K 1/0289 174/250 |
| 2016/0073528 A1 | 3/2016 | Park et al. | |
| 2016/0147361 A1* | 5/2016 | Ahn | G06F 3/0416 345/173 |
| 2016/0363800 A1 | 12/2016 | Kim | |
| 2017/0194411 A1 | 7/2017 | Park et al. | |
| 2018/0027673 A1 | 1/2018 | Andou | |
| 2018/0076412 A1* | 3/2018 | Kim | H04M 1/0266 |

FOREIGN PATENT DOCUMENTS

| | | |
|---|---|---|
| KR | 1020160106829 | 9/2016 |
| KR | 101870798 | 6/2018 |
| WO | WO 2014/119972 | 8/2014 |
| WO | WO 2016/111895 | 7/2016 |

* cited by examiner

OLED DISPLAY APPARATUS WITH REDUCED BEZEL

CROSS-REFERENCE TO RELATED APPLICATIONS

This U.S. non-provisional patent application claims priority under 35 U.S.C. § 119 to Korean Patent Application No. 10-2018-0020720, filed on Feb. 21, 2018, the entire contents of which are hereby incorporated by reference.

TECHNICAL FIELD

The present disclosure relates to a display apparatus, and more particularly, to an organic light emitting diode (OLED) display apparatus with a reduced bezel.

DISCUSSION OF THE RELATED ART

Organic light emitting diode (OLED) displays represent an important display technology. As with most modern display devices, OLED displays often include a display panel and a touch panel. The display panel includes a plurality of pixels configured to display an image. Each of the plurality of pixels includes an organic light emitting diode (OLED) and a circuit unit configured to control the organic light emitting diode. The circuit unit includes at least a control transistor, a drive transistor, and a storage capacitor. The touch panel may be disposed on the display panel to sense a touch input and calculate touch coordinates therefrom.

A display circuit board is generally connected to the display panel, and a touch circuit board is generally connected to the touch panel.

Many modern display panels, such as OLED display devices, are configured to be bent. However, it is possible that in bending these display panels, cracks might occur. These cracks may render the display device inoperable or otherwise defective.

SUMMARY

A display apparatus includes a touch screen panel having an active area and a non-active area defined thereon. The non-active area at least partially surrounds the active area. The touch screen panel includes a first side and a second side. A display flexible printed circuit board is connected to the touch screen panel. The display flexible printed circuit board at least partially overlaps the first side of the touch screen panel. A touch flexible printed circuit board is connected to the touch screen panel. The touch flexible printed circuit board at least partially overlaps the second side of the touch screen panel. The touch flexible printed circuit board is bent toward a lower surface of the touch screen panel. A reinforcement member contacts a lower surface of the touch flexible printed circuit board. A portion of a side surface of the touch screen panel is connected to the second side of the touch screen panel.

A display apparatus includes a display panel having a first side extending primarily in a first direction. The display panel has an active area and a non-active area defined thereon. The non-active are at least partially surrounds the active area. The display panel is bent with respect to a first reference axis extending in the first direction. A touch sensing unit is disposed on the display panel and has a second side extending in a second direction crossing the first direction. A display flexible printed circuit board is connected to the display panel. The display flexible printed circuit board at least partially overlaps the first side of the display panel. A touch flexible printed circuit board is connected to the touch sensing unit. The touch flexible printed circuit board at least partially overlaps the second side of the touch sensing unit. The touch flexible printed circuit board is bent with respect to a second reference axis extending in the second direction. A reinforcement member contacts both a lower surface of the touch flexible printed circuit board and a portion of a side surface of the display panel.

BRIEF DESCRIPTION OF THE FIGURES

A more complete appreciation of the present disclosure and many of the attendant aspects thereof will be readily obtained as the same becomes better understood by reference to the following detailed description when considered in connection with the accompanying drawings, wherein:

FIG. 1 is a cross-sectional view taken along line II-II' of FIG. 3, in a display apparatus according to an exemplary embodiment of the present inventive concept.

DETAILED DESCRIPTION

Figure 1:
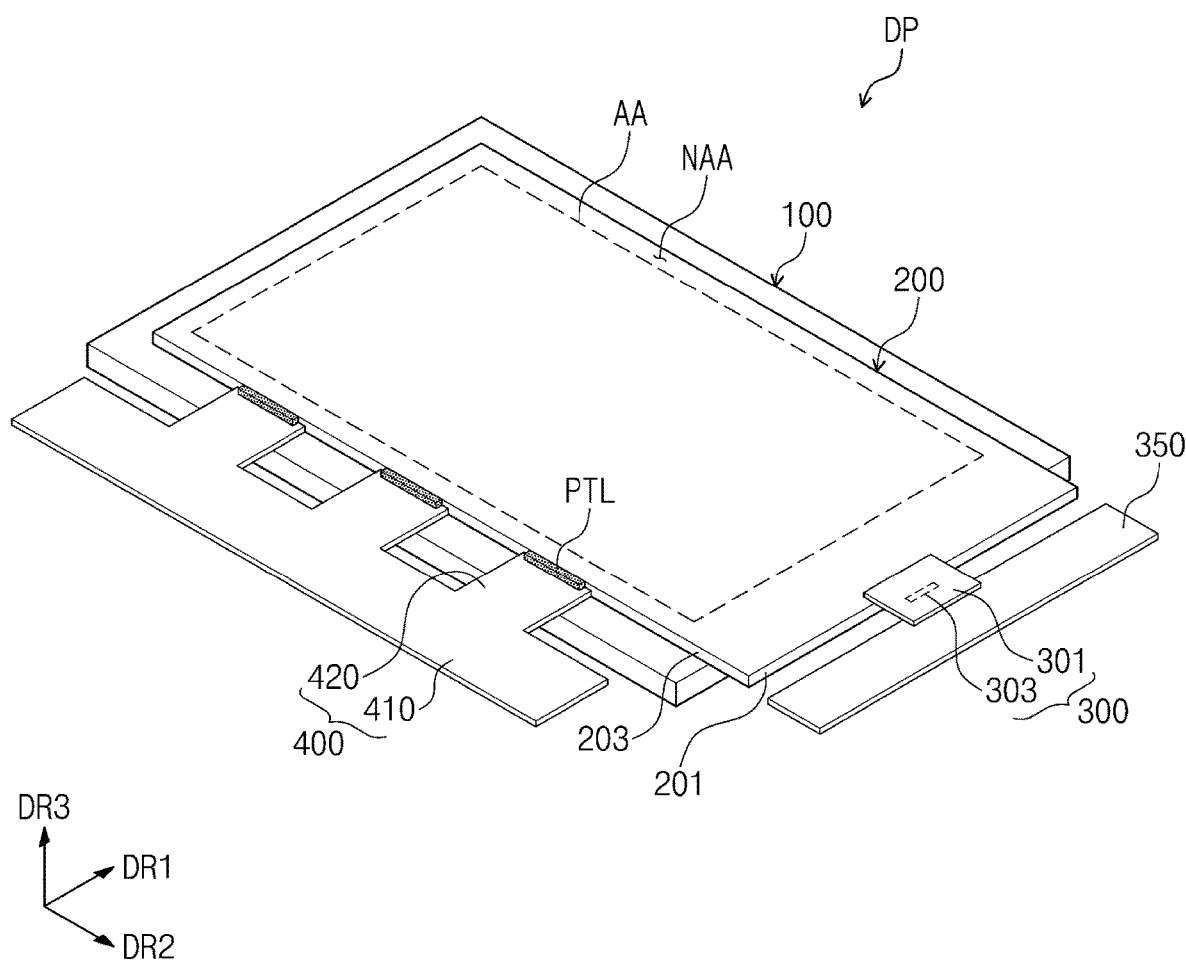
FIG. 1 is a perspective view illustrating a display apparatus according to an exemplary embodiment of the present inventive concept.

The inventive concept may be modified in many alternate forms, and thus specific embodiments will be exemplified in the drawings and described in detail in the text. It should be understood, however, that the invention is not intended to be limited to the particular forms disclosed, but rather, is intended to cover all modifications, equivalents, and alternatives falling within the spirit and scope of the present disclosure.

In the following description, the terms "upper" and "lower" are used herein to describe the directions based on the drawings. Also, it will be understood that when a portion of a layer, a film, a region, a plate, or the like is referred to as being "on" another portion, it can be "directly on" the other portion, or intervening layers may also be present. Moreover, it will be understood that when a portion such as a layer, a film, an area, a plate, or the like is referred to as being "under" another portion, it can "be directly under" the other portion, or intervening portions may also be present.

Figure 2:
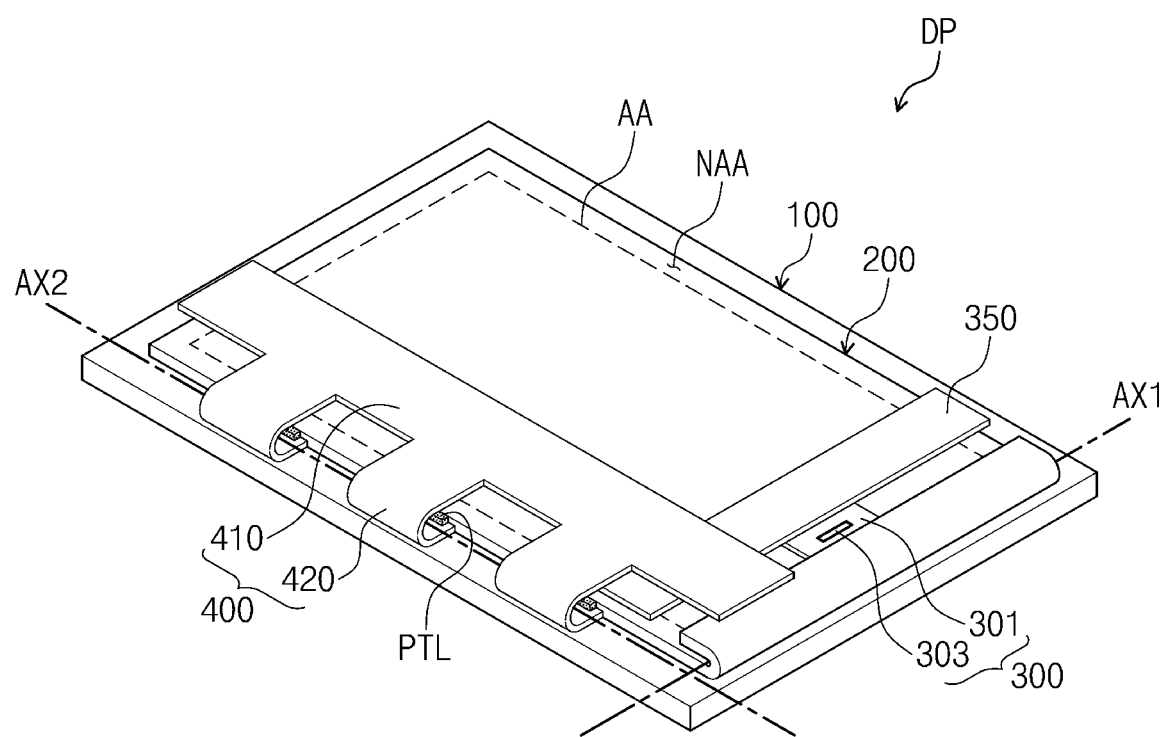
FIG. 2 is a perspective view illustrating a state in which a display flexible printed circuit board and a touch flexible printed circuit board of the display apparatus of FIG. 1 are bent.
Figure 2:
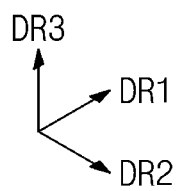
Figure 3:
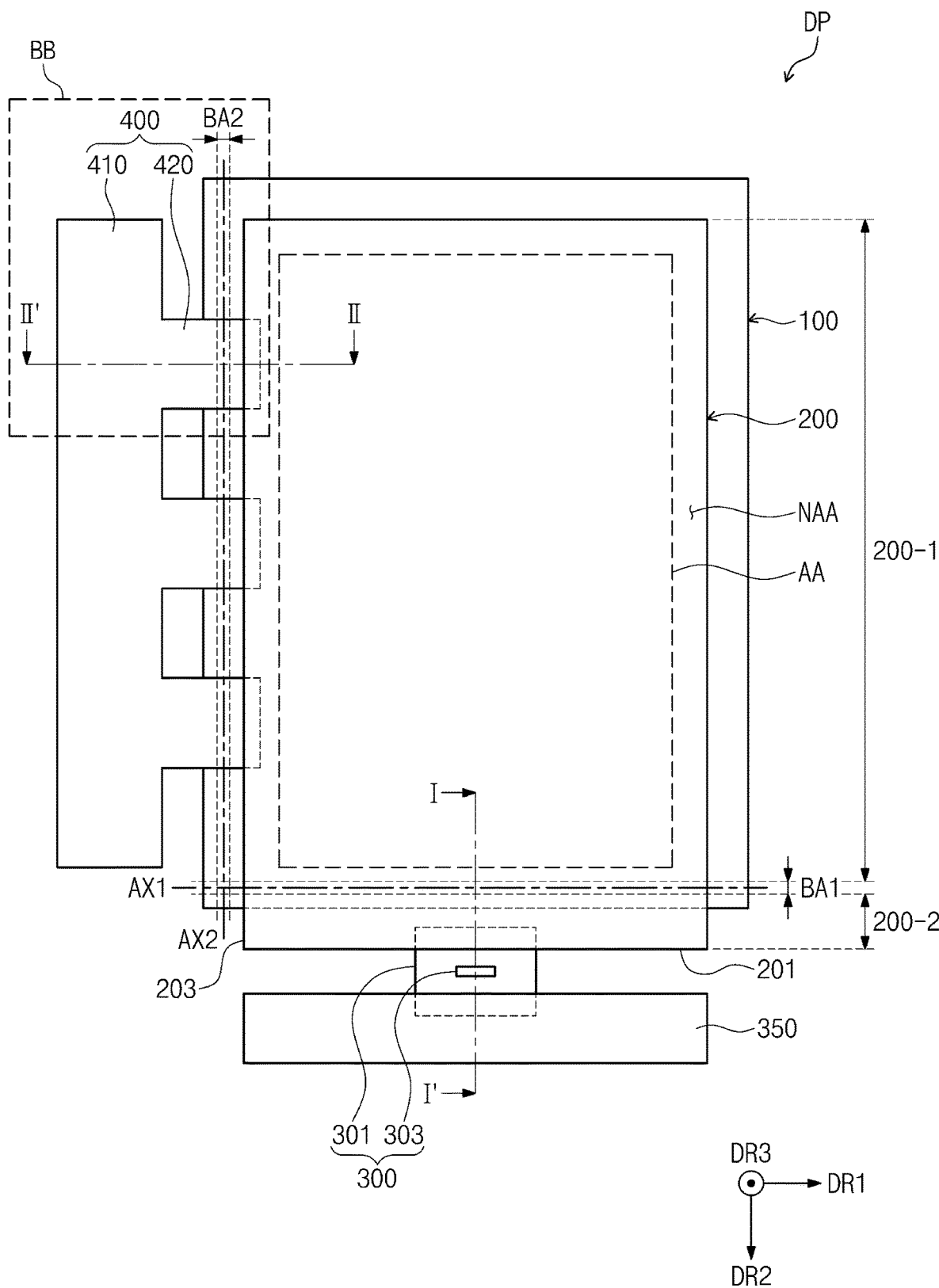
FIG. 3 is a plan view illustrating a touch screen panel, a display flexible printed circuit board, and a touch flexible printed circuit board according to an exemplary embodiment of the present inventive concept.

FIG. 1 is a perspective view illustrating a display apparatus according to an exemplary embodiment of the present inventive concept. FIG. 2 is a perspective view illustrating a state in which a display flexible printed circuit board and a touch flexible printed circuit board in the display apparatus of FIG. 1 are bent. FIG. 3. is a plan view illustrating a touch screen panel, a display flexible printed circuit board, and a touch flexible printed circuit board, according to an exemplary embodiment of the present inventive concept.

Referring to FIGS. 1 to 3, a display apparatus DP may include a window, which may be referred to herein as a "window member" 100, a touch screen panel 200, a display flexible printed circuit board 300, a touch flexible printed circuit board 400, and a reinforcement member PTL, which may be a supportive structural element, such as a block or rectangular prism (e.g. cuboid).

FIGS. 1 and 2 illustrate a display apparatus DP which is turned upside down for convenience of description, and the direction in which an image is displayed is a lower direction (a direction opposite to DR3) in the drawings. In the present specification, the vertical relationship between elements is determined on the basis of the form in which the display apparatus DP illustrated in FIGS. 1 and 2 is turned upside down.

The window member 100 is disposed on the touch screen panel 200. The window member 100, so disposed, may serve to protect the touch screen panel 200 from external impact. The window member 100 may have a wider area than that of the touch screen panel 200.

In the touch screen panel 200, an active area AA and a non-active area NAA may be defined.

The active area AA may be configured to display an image and sense the touch input. The non-active area NAA is adjacent to the active area AA, and does not display an image and does not sense the touch input. Thus, all of the pixels of the touch screen panel 200, as well as all of the touch sensing elements of the touch screen panel 200, may be disposed exclusively within the active area AA, and not in the non-active area NAA.

The touch screen panel 200 may include a first side 201 and a second side 203 which primarily extend in directions different from each other (e.g. the first side 201 and the second side 203 may meet at a right angle).

According to an exemplary embodiment of the present inventive concept, the extending direction of the first side 201 of the touch screen panel 200 may be defined as a first direction DR1, the extending direction of the second side 203 of the touch screen panel 200 may be defined as a second direction DR2, and the thickness direction of the touch screen panel 200 may be defined as a third direction DR3.

When the touch screen panel 200 is viewed from the third direction DR3, the first side 201 and the second side 203 may be an upper side or a lower side of the side surface of the touch screen panel 200. However, in FIGS. 1 and 2, the lower side of the side surface of the touch screen panel 200 is illustrated exemplarily.

The display flexible printed circuit board 300 may be connected to the touch screen panel 200 and may at least partially overlap the first side 201 of the touch screen panel 200.

The display flexible printed circuit board 300 may include a flexible wiring substrate 301 and a drive circuit chip 303. The drive circuit chip 303 is electrically connected to wirings of the flexible wiring substrate 301. A signal output from the drive circuit chip 303 may be applied to pixels of the touch screen panel 200 and a gate drive circuit through the wirings of the flexible wiring substrate 301.

The display apparatus DP may further include a printed circuit board 350.

The printed circuit board 350 may be connected to the display flexible printed circuit board 300 and the printed circuit board 350 may receive/transmit signals from/to the drive circuit chip 303. The printed circuit board 350 may supply image data, control signals, power supply voltage, etc. to the touch screen panel 200 or the display flexible printed circuit board 300.

The touch flexible printed circuit board 400 may be connected to the second side 203 of the touch screen panel 200. The touch flexible printed circuit board 400 may receive/transmit signals for touch coordinate sensing from/to the touch screen panel 200.

The touch flexible printed circuit board 400 may include a main portion 410 and branch portions 420.

The branch portions 420 may protrude from the main portion 410. The branch portions 420 may be provided in plurality and each of the plurality of branch portions 420 may be spaced apart from its neighboring branch portions in the second direction DR2. Each of the plurality of branch portions 420 may protrude from the same main portion 410. The main portion 410 and the branch portions 420 may all together have a single integral shape. The branch portions 420 may be connected to the touch screen panel 200.

According to an exemplary embodiment of the present inventive concept, a touch drive chip may be mounted on the touch flexible printed circuit board 400, and the signals for touch coordinate sensing may be received/transmitted through the touch drive chip. However, the present invention is not limited thereto, and a separate touch printed circuit board may be attached to the touch flexible printed circuit board 400, and the touch drive chip may be mounted on the touch printed circuit board.

The reinforcement member PTL may be in contact with both a lower surface of the touch flexible printed circuit board 400 and a portion of the side surface of the touch screen panel 200.

A first bending area BA1 may be defined in the non-active area NAA of the touch screen panel 200. The first bending area BA may extend in the first direction DR1 and may be defined between the active area AA and the display flexible printed circuit board 300.

The touch screen panel 200 may be bent about a first reference axis AX1 extending in the first direction DR1 within the first bending area BA1.

A second bending area BA2 may be defined in the touch flexible printed circuit board 400. The second bending area BA2 may extend in the second direction DR2. The touch flexible printed circuit board 400 may be bent about a second reference axis AX2 extending in the second direction DR2 within the second bending area BA2.

The first bending area BA1 and the second bending area BA2 may each be defined in the window member 100.

In a state in which the touch flexible printed circuit board 400 is bent, the window member 100 may be exposed through spaces between the branch portions 420. The widow member 100 may be supported by a frame disposed between the several branch portions 420.

The touch screen panel 200 may be divided into a first portion 200-1 and a second portion 200-2. The first bending area BA1 may separate the first portion 200-1 from the second portion 200-2. In the first portion 200-1, both the active area AA and a portion of the non-active area NAA are present, and in the second portion 200-2, only the non-active area is present.

In a state in which the touch screen panel 200 and the touch flexible printed circuit board 400 are bent through the first bending area BA1 and the second bending area BA2, the second portion 200-2 of the touch screen panel 200 may at least partially overlap the main portion 410 of the touch flexible printed circuit board 400.

As a comparative example, it may be assumed that the display flexible printed circuit board and the touch flexible printed circuit board are connected to one side of the touch screen panel. In this case, the display flexible display circuit board or the touch flexible printed circuit board is bent to the outside of the touch flexible printed circuit board, so that the radius of curvature is increased. In order to cover the radius of curvature of the touch flexible printed circuit board, a size of a bezel may be increased around one side of the touch screen panel.

In the display apparatus DP, according to an exemplary embodiment of the present inventive concept, the display flexible printed circuit board 300 and the touch flexible printed circuit board 400 are connected to different sides of the touch screen panel 200, so that the radius of curvature of the touch flexible printed circuit board 400 may be minimized, and the bezel of the display apparatus DP may be reduced.

Figure 4:
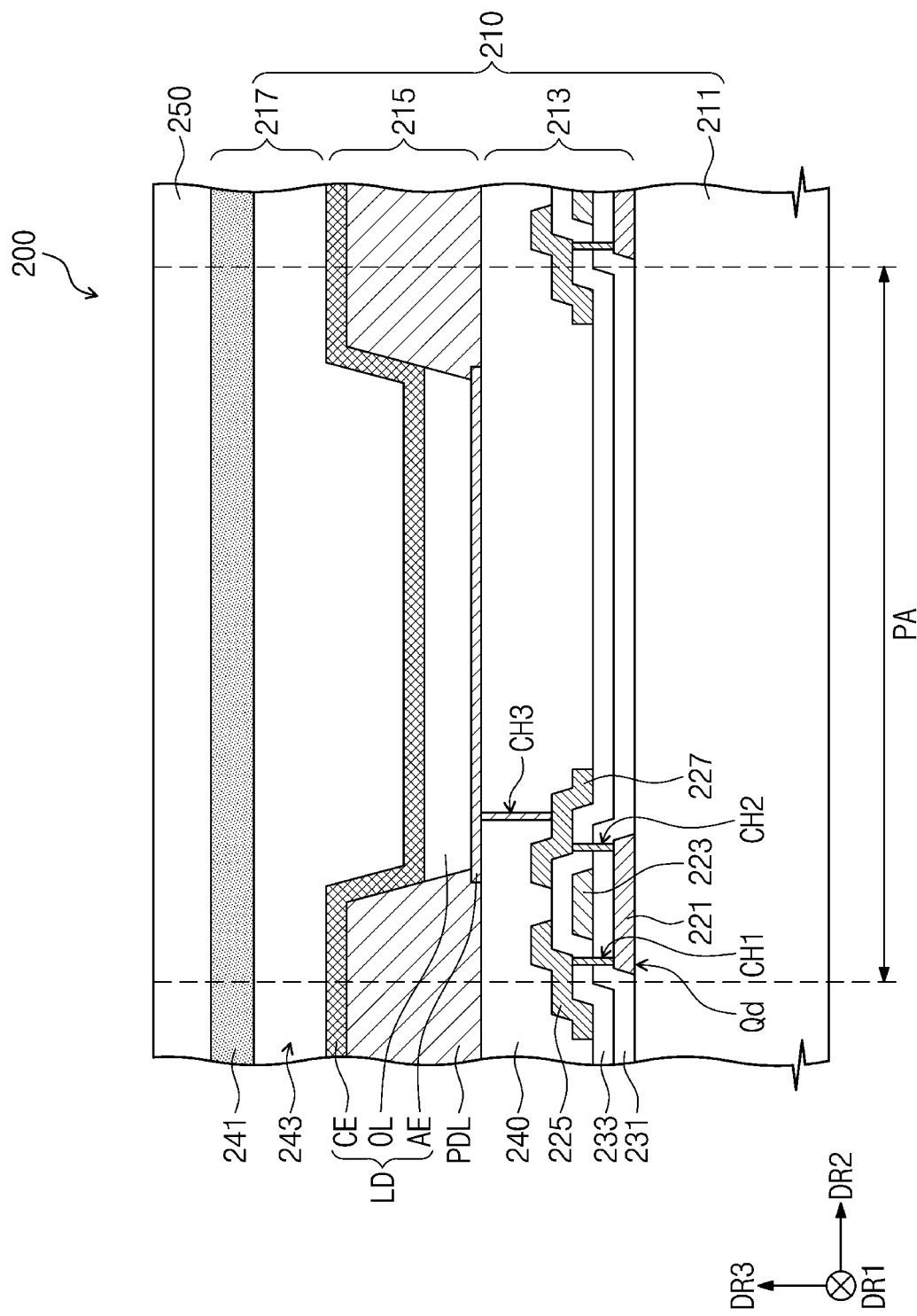
FIG. 4 is a cross-sectional view illustrating a portion of a touch screen panel.

FIG. 4 is a cross-sectional view illustrating a portion of a touch screen panel. In FIG. 4, one pixel may be disposed in one pixel area PA.

Referring to FIG. 4, the touch screen panel 200 may include a display panel 210 and a touch sensing unit 250.

The display panel 210 may be flexible. According to an exemplary embodiment of the present inventive concept, the display panel 210 will be exemplarily described as an organic light emitting display panel.

The display panel 210 may include a base substrate 211, a drive layer 213, an organic light emitting device layer 215 and an encapsulation layer 217.

The base substrate 211 may be a flexible substrate, and may be made of a plastic having excellent heat resistance and durability, such as polyethylene ether phthalate, polyethylene naphthalate, polycarbonate, polyacrylate, polyether imide, polyether sulfone, polyimide, or the like. Hereinafter, the base substrate 211 will be exemplarily described as a base substrate including polyimide.

The drive layer 213 may include devices for providing signals to the organic light emitting device layer 215. The drive layer 213 may include various signal lines, for example, a scan line, a data line, a power supply line, and a light emitting line. The drive layer 213 may include a plurality of transistors and capacitors. The transistors may include a switching transistor and a drive transistor Qd.

In FIG. 4, the drive transistor Qd is illustrated exemplarily. The drive transistor Qd includes an active layer 221, a gate electrode 223, a source electrode 225, and a drain electrode 227.

The active layer 221 may be disposed on the base substrate 211. The drive layer 213 may further include a first insulation layer 231 disposed between the active layer 221 and the gate electrode 223. The first insulation layer 231 may insulate the active layer 221 and the gate electrode 223 from each other. The source electrode 225 and the drain electrode 227 may each be disposed on the gate electrode 223. The drive layer 213 may further include a second insulation layer 233 disposed between the gate electrode 223 and the source electrode 225 and between the gate electrode 223 and the drain electrode 227. The source electrode 225 and the drain electrode 227 may be respectively connected to the active layer 221 through contact holes CH1 and CH2 provided in the first insulation layer 231 and the second insulation layer 233.

The drive layer 213 may further include a protective film 240 disposed on the source electrode 225 and the drain electrode 227. The protective film 240 may be planarizing.

The present invention is not limited to the structure of the drive transistor Qd illustrated in FIG. 4, and the relative positions and structures of the active layer 221, the gate electrode 223, the source electrode 225 and the drain electrode 227 may be changed into various forms. For example, although the gate electrode 223 is illustrated as being disposed on the active layer 221 in FIG. 3, the gate electrode 223 may be disposed under the active layer 221.

The switching transistor and the drive transistor Qd may have the same structure. However, the present invention is not limited thereto, and the switching transistor and the drive transistor Qd may have different structures. For example, an active layer of the switching transistor and the active layer 221 of the drive transistor Qd may be disposed on different layers.

The drive layer 213 may further include one or more display pads. Referring back to FIG. 3, the drive layer 213 may be disposed along the first side 201 of the touch screen panel 200 at a position at least partially overlapping the display flexible printed circuit board 300.

The organic light emitting device layer 215 may include an organic light emitting diode LD. According to an exemplary embodiment of the present inventive concept, the organic light emitting diode LD is a front light emitting type organic light emitting diode, and it may emit light in the third direction DR3.

The organic light emitting diode LD may include a first electrode AE, an organic layer OL, and a second electrode CE.

The first electrode AE is disposed on the protective film 240. The first electrode AE is connected to the drain electrode 227 through a contact hole CH3 formed in the protective film 240.

The first electrode AE may be a pixel electrode or a positive electrode. The first electrode AE may be a semi-transmissive electrode or a reflective electrode (i.e. semi-transmissive of light or reflective of light). When the first electrode AE is a semi-transmissive electrode or a reflective electrode, the first electrode AE may include silver (Ag), magnesium (Mg), aluminum (Al), platinum (Pt), palladium (Pd), gold (Au), nickel (Ni), neodymium (Nd), iridium (Ir), chromium (Cr) or a mixture thereof.

The first electrode AE may be a single layer, or a multilayered structure having a plurality of layers made of a metal oxide or metal. For example, the first electrode AE may have, but is not limited to having, a single layer structure made of indium tin oxide (ITO), Ag or a metallic mixture (e.g., a mixture of Ag and Mg), a two-layer structure made of ITO/Mg or ITO/MgF, or a three-layer structure made of ITO/Ag/ITO.

The organic layer OL may include an organic emission layer EML made of a low-molecular organic material or a polymer organic material. The organic emission layer may emit light. The organic layer OL may optionally include, in addition to the organic emission layer, a hole transport layer HTL, a hole injection layer HIL, an electron transport layer ETL, an electron injection layer EIL, and the like.

Holes and electrons are injected into the organic emission layer inside the organic layer OL from the first electrode AE and the second electrode CE, respectively. In the organic emission layer, excitons are formed by combinations of holes and electrons, and thus light is emitted while the excitons relax from the excited state to the ground state.

The second electrode CE may be provided on the organic layer OL. The second electrode CE may be a common electrode or a negative electrode. The second electrode CE may be a transmissive electrode or a semi-transmissive electrode (i.e. semi-transmissive of light or reflective of light). When the second electrode CE is a transmissive or semi-transmissive electrode, the second electrode CE may include lithium (Li), lithium 8-quinolate (Liq), calcium (Ca), lithium fluoride (LiF)/Ca, LiF/Al, Al, Mg, barium fluoride (BaF), barium (Ba), Ag or a compound or mixture (e.g., a mixture of Ag and Mg) thereof.

The second electrode CE may include an auxiliary electrode. The auxiliary electrode may include a layer formed by depositing the material to face the emission layer, and a transparent metal oxide on the layer, such as indium tin oxide (ITO), indium zinc oxide (IZO), zinc oxide (ZnO) and indium tin zinc oxide (ITZO). Also, the auxiliary electrode may include molybdenum (Mo), thallium (Ti), Ag, or the like.

The organic light emitting device layer 215 may further include a pixel definition layer PDL disposed on the protective film 240. The pixel definition layer PDL may be disposed so as to at least partially overlap a boundary of the pixel area PA on a plane.

The encapsulation layer 217 may be disposed on an upper portion of the organic light emitting device layer 215. The encapsulation layer 217 may block the penetration of ambient moisture and air into the organic light emitting device layer 215. The encapsulation layer 217 may include an encapsulation substrate 241 and a sealing member disposed thereon. The sealing member is disposed along an edge of the encapsulation substrate 241, and may seal the organic light emitting diode LD together with the encapsulation substrate 241. An interior space 243 formed by the encapsulation substrate 241 and the sealing member may be evacuated. However, the present invention is not limited thereto, and the interior space 243 may be filled with nitrogen ($N_2$), or may be filled with a filling member made of an insulation material.

Unlike the structure illustrated FIG. 4, the encapsulation layer 217 may include an organic layer and an inorganic layer that are stacked multiple times in the form of a thin film.

The touch sensing unit 250 may be disposed at an upper portion of the display panel 210. The touch sensing unit 250 may be configured to sense the user's touch.

The touch flexible printed circuit board 400 may be connected to the touch sensing unit 250. The touch flexible printed circuit board 400 may provide a touch drive signal to the touch sensing unit 250, and may be configured to sense a touch coordinate from the provided touch drive signal.

Figure 5:
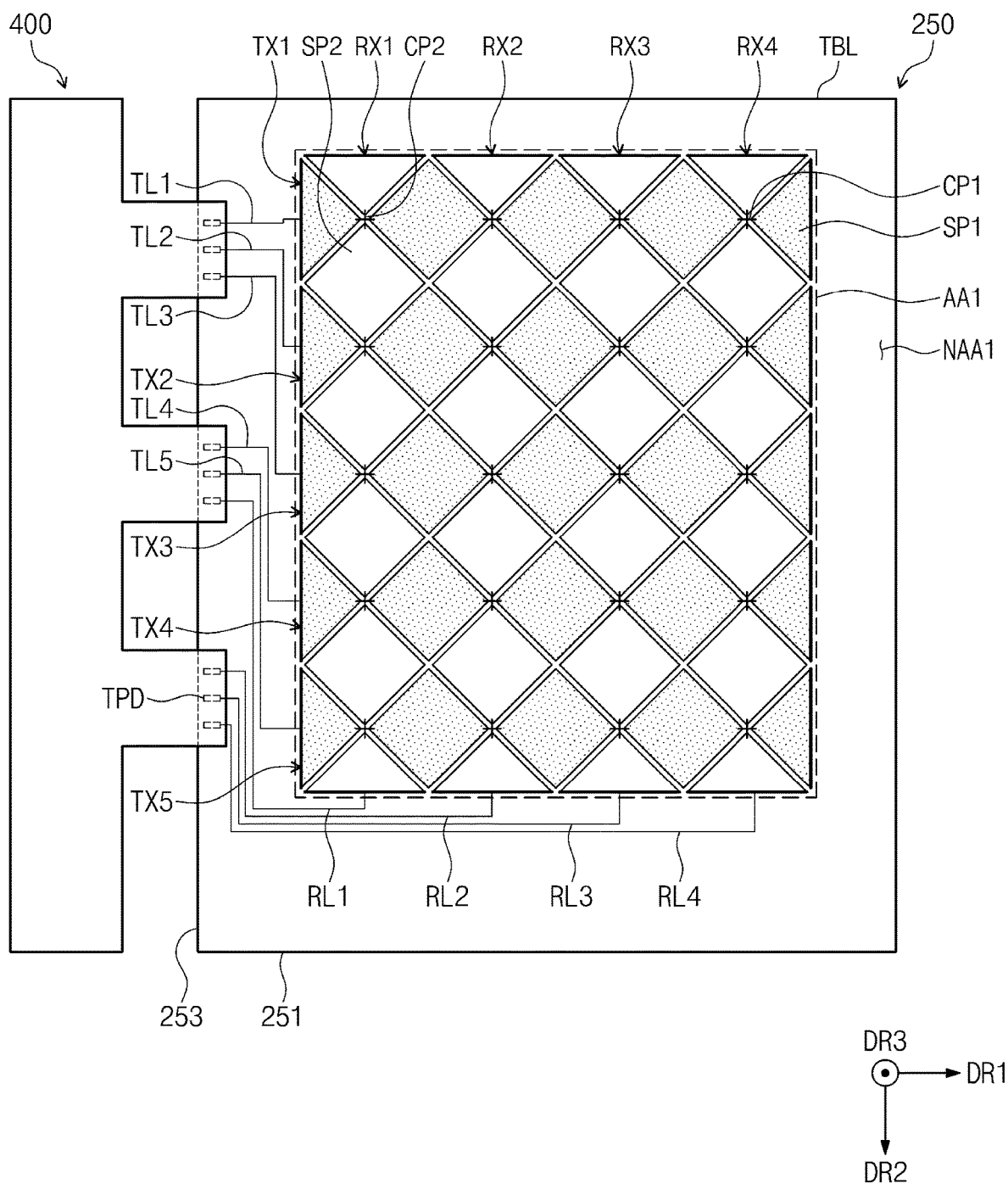
FIG. 5 is a plan view illustrating the touch sensing unit and the touch flexible printed circuit board of FIG. 4.

FIG. 5 is a plan view illustrating the touch sensing unit and the touch flexible printed circuit board of FIG. 4.

Referring to FIG. 5, the touch sensing unit 250 may be realized as a static capacitance type. The touch sensing unit 250 may be operated in a way in which touch coordinates are extracted based on capacitance variation amounts of capacitors formed by two kinds of touch lines extending in different directions and insulated and a way in which touch coordinates are extracted based on a capacitance variation amount of capacitors formed by a plurality of touch electrodes disposed in the active area. In the following description, the touch sensing unit 250 will be described in terms of an example operated in the former way.

The touch sensing unit 250 may be divided into an active area AA1 and a non-active area NAA1. The active area AA1 and the non-active area NAA1 of the touch sensing unit 250 may be substantially the same as the active area AA and the non-active area NAA illustrated in FIG. 1, respectively. The touch sensing unit 250 may sense a touch input from the active area AA1, and might not sense the touch input from the non-active area NAA1.

The touch sensing unit 250 may include a base layer TBL, transmission touch lines TX1 to TX5, sensing touch lines RX1 to RX4, transmission lines TL1 to TL5, sensing lines RL1 to RL5, and touch pads TPD.

Each of the transmission touch lines TX1 to TX5 includes a plurality of transmission touch sensor units SP1 and a plurality of first connection units CP1. The transmission touch sensor units SP1 are aligned along the first direction DR1. Each of the first connection units CP1 connects two adjacent transmission touch sensor units SP1 among the transmission touch sensor units SP1. Each of the transmission touch sensor units SP may have a mesh shape having openings disposed therein.

The sensing touch lines RX1 to RX4 insulate and cross the transmission touch lines TX1 to TX5. Each of the sensing touch lines RX1 to RX4 includes a plurality of sensing touch sensor units SP2 and a plurality of second connection units CP2. The sensing touch sensor units SP2 are aligned along the second direction DR2. Each of the second connection units CP2 connects two adjacent sensing touch sensor units SP2 among the sensing touch sensor units SP2. Each of the sensing touch sensor units SP2 may have a mesh shape having various openings disposed therein.

According to an exemplary embodiment of the present inventive concept, the transmission touch sensor units SP1 and the first connection units CP1 may be disposed on a first layer, and the sensing touch sensor units SP2 and the second connection units CP2 may be disposed on a second layer different from the first layer. According to an exemplary embodiment of the present inventive concept, the transmission touch sensor units SP1, the first connection units CP1, and the sensing touch sensor units SP2 may be disposed on the first layer, and the second connection units CP2 may be disposed on the second layer different from the first layer.

The transmission touch lines TX1 to TX5 and the sensing touch lines RX1 to RX4 form a touch capacitor. The touch sensing unit 250 may sense a touch input coordinate based on the capacitance variation amount of the touch capacitor.

One end of each of the transmission lines TL1 to TL5 may be connected to the transmission touch lines TX1 to TX5. The other end of each of the transmission lines TL1 to TL5 may be connected to the touch pads TPD. The transmission lines TL1 to TL5 may provide the touch drive signals applied from the touch flexible printed circuit board 400 to the transmission touch lines TX1 to TX5 through the touch pads TPD.

One end of each of the sensing lines RL1 to RL4 may be connected to the sensing touch lines RX1 to RX4. The other end of each of the sensing lines RL1 to RL4 may be connected to the touch pads TPD. The sensing lines RX1 to RX4 may provide the sensing signals received from the sensing touch lines RX1 to RX4 to the touch flexible printed circuit board 400 through the touch pads TPD.

The touch sensing unit 250 includes a first side 251 extending in the first direction DR1 and a second side 253 extending in the second direction DR2. The first side 251 of the touch sensing unit 250 corresponds to the first side 201 of the touch screen panel 200 described with reference to FIGS. 1 and 2. The second side 253 of the touch sensing unit 250 corresponds to the second side 203 of the touch screen panel 200 described with reference to FIGS. 1 and 2.

The touch pads TPD may be disposed along the second side 253 of the touch sensing unit 250.

Figure 6:
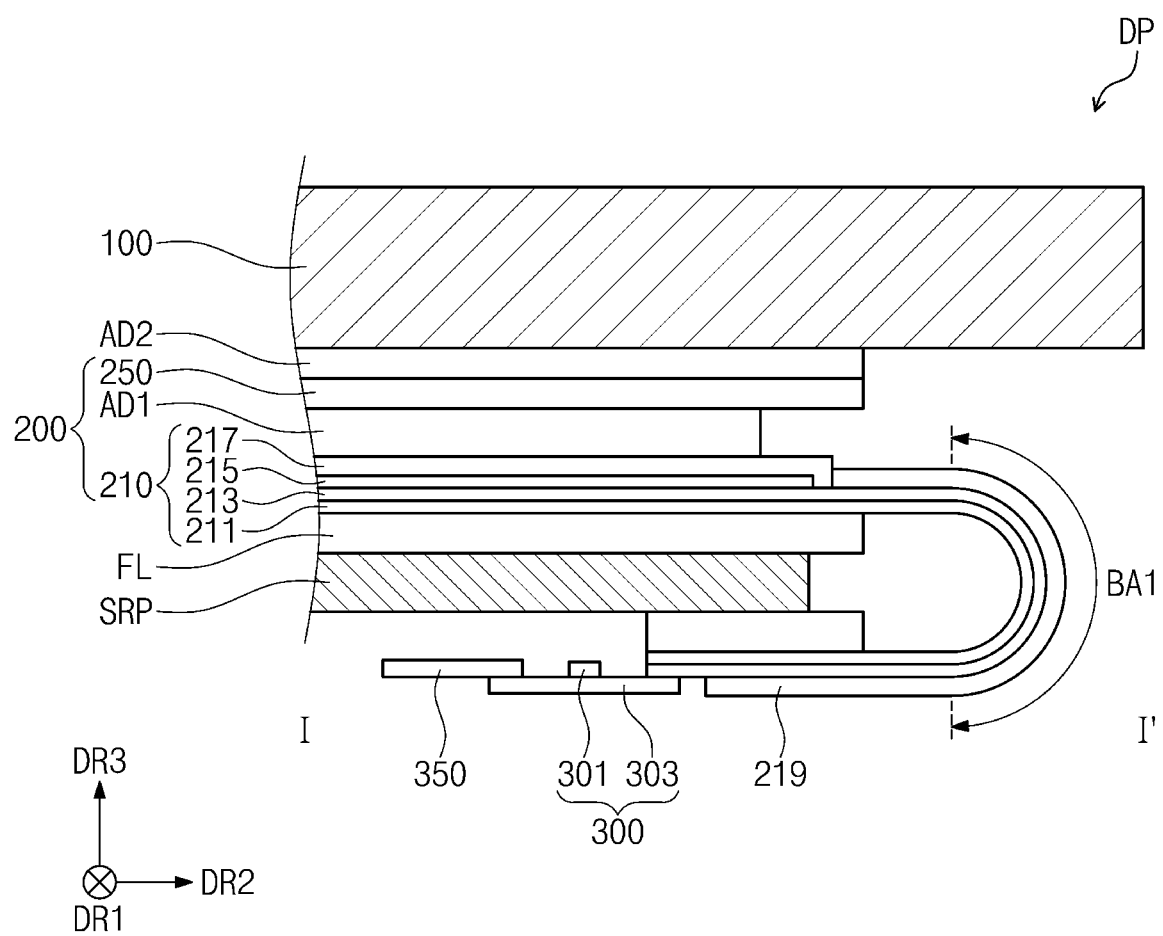
FIG. 6 is a cross-sectional view taken along line I-I' of FIG. 3, in a display apparatus according to an exemplary embodiment of the present inventive concept.
Figure 7:
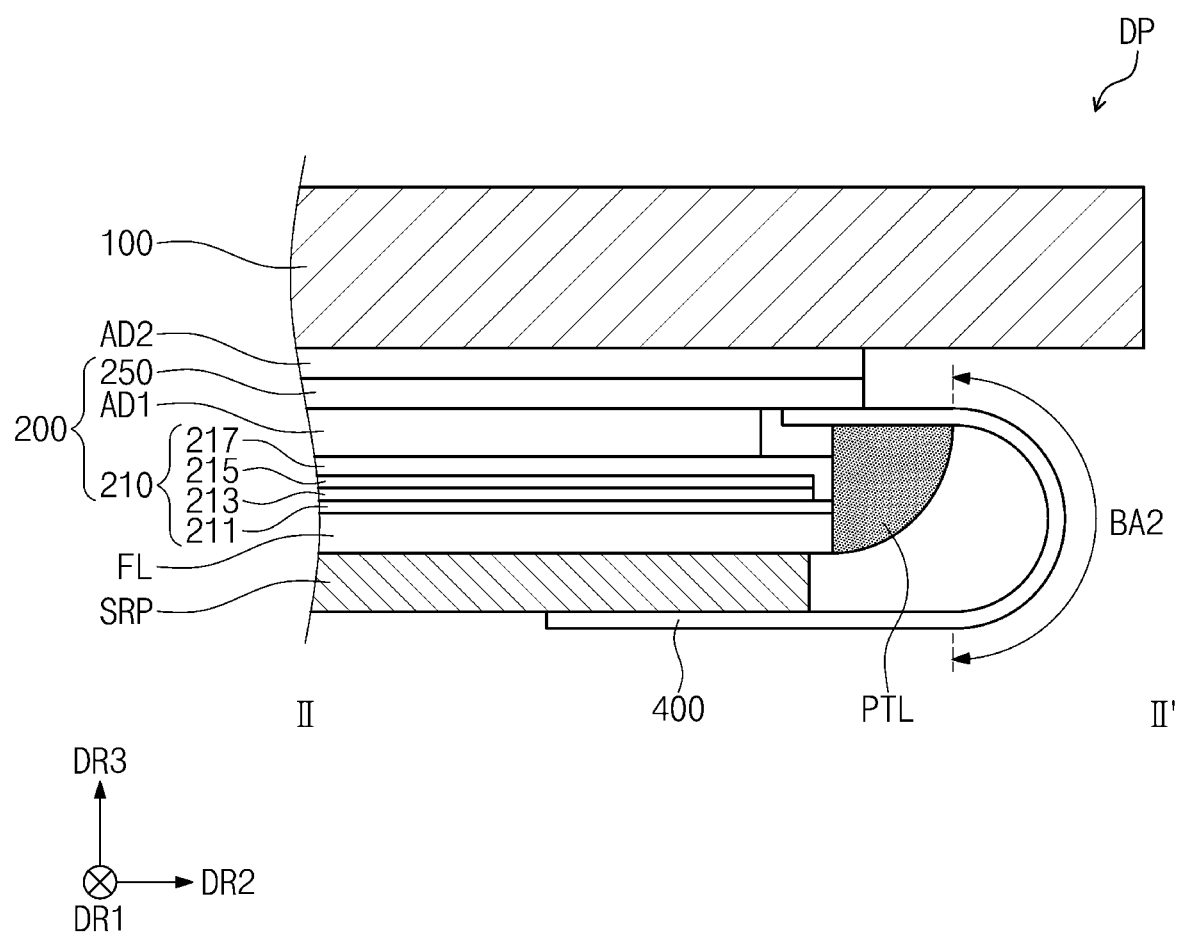
FIG. 7 is a cross-sectional view taken along line II-II' of FIG. 3, in a display apparatus according to an exemplary embodiment of the present inventive concept.

FIG. 6 is a cross-sectional view taken along line I-I' of FIG. 3, in a display apparatus according to an exemplary embodiment of the present inventive concept, and FIG. 7 is a cross-sectional view taken along line II-II' of FIG. 3, in a display apparatus according to an exemplary embodiment of the present inventive concept.

Referring to FIG. 6, the base substrate 211 and the drive layer 213 of the display panel 210 may be bent in the first bending area BA1.

The touch screen panel 200 may further include a protective film FL disposed on a lower portion of the base substrate 211.

The protective film FL may protect the base substrate 211. The protective film FL may be made of polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), or the like.

The protective film FL is not disposed in the first bending area BA1. Therefore, the base substrate 211 and the drive layer 213 may be easily bent in the first bending area BA1.

The display panel 210 may further include a stress compensation layer 219. The stress compensation layer 219 may be disposed on the drive layer 213 and may cover the first bending area BA1. A neutral surface of the display panel 210 may be adjusted in the first bending area BA1 by the stress compensation layer 219. Also, as the base substrate 211 and the drive layer 213 are bent, the tensile stress applied to the base substrate 211 and the drive layer 213 may be mitigated.

The display apparatus DP may further include a sensor unit SRP. The sensor unit SRP may be disposed on the lower portion of the protective film FL. The sensor unit SRP may include, but is not limited to including, various sensors such as a force sensor. According to an exemplary embodiment of the present inventive concept, the sensor unit SRP might be omitted.

The display panel 210 and the touch sensing unit 250 may be attached by a first adhesion layer AD1. The first adhesion layer AD1 may be made of a urethane-based material, an acryl-based material, a silicon-based material, or the like.

The touch sensing unit 250 and the window member 100 may be attached by a second adhesion layer AD2. The second adhesion layer AD2 may be made of one of the aforementioned materials and may be made of the same material as the first adhesion layer AD1.

Referring to FIG. 7, in an exemplary embodiment of the present inventive concept, the touch flexible printed circuit board 400 may be attached to the lower surface of the touch sensing unit 250.

The reinforcement member PTL may be in contact with the lower surface of the touch flexible printed circuit board 400 and a portion of the side surface of the touch screen panel 200. For example, the reinforcement member PTL may be attached to the side surface of the display panel 210 and to the lower surface of the touch flexible printed circuit board 400. In this case, the reinforcement member PTL may be attached to at least the base substrate 211 and the encapsulation layer 217 of the display panel 210. The reinforcement member PRL may be attached to the protective film FL.

The reinforcement layer PTL may be made of a photo-curable material, a thermosetting material, or a natural curable material.

As the touch flexible printed circuit board 400 is bent, cracks may occur in the vicinity of the adhesion portion between the touch flexible printed circuit board 400 and the touch sensing unit 250. The reinforcement member PTL is attached to the side surface of the display panel 210, so that cracks may be prevented from occurring in the touch flexible printed circuit board 400.

Figure 8:
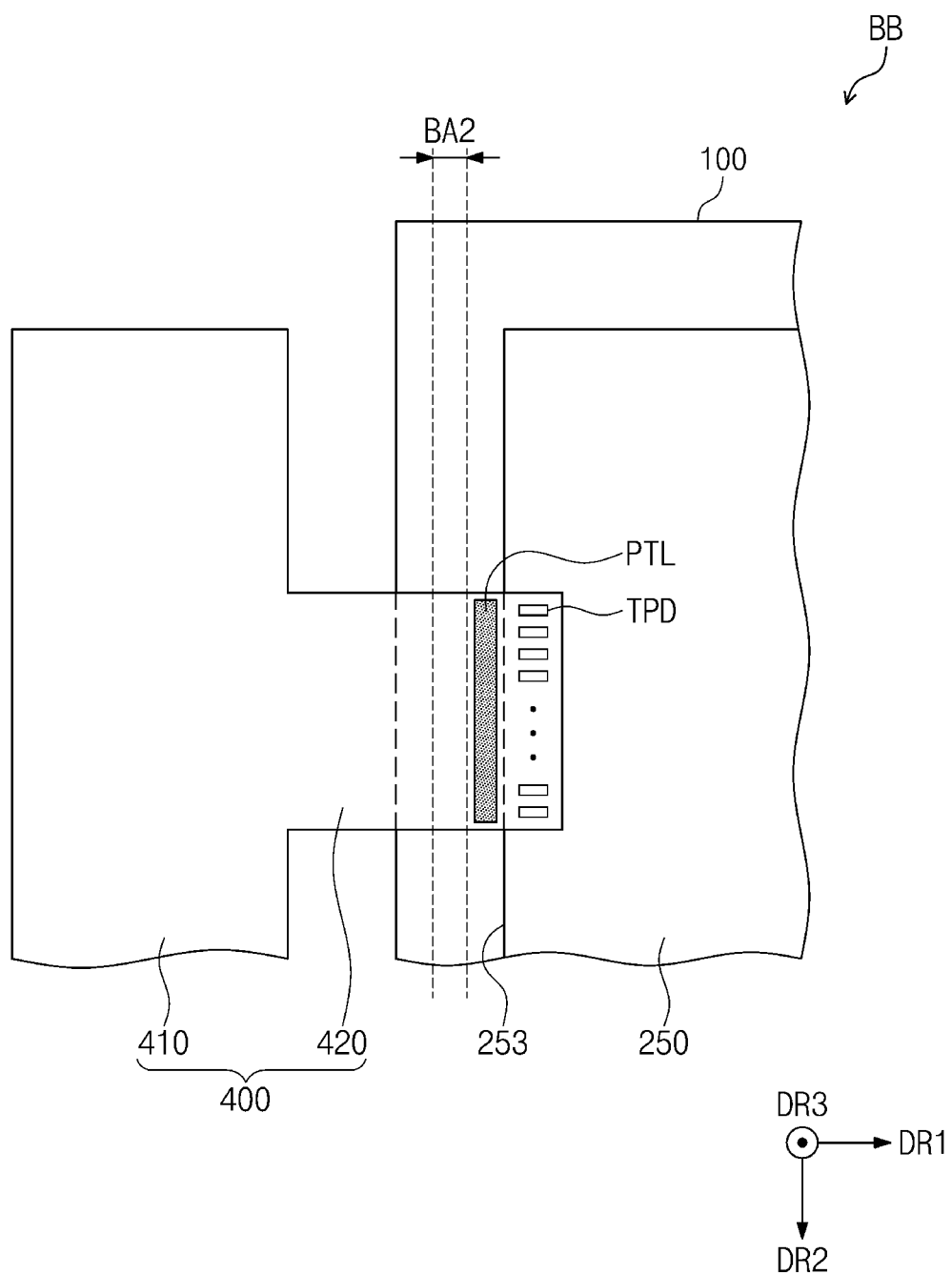
FIG. 8 is an enlarged plan view illustrating area BB of FIG. 3.

FIG. 8 is an enlarged plan view illustrating area BB of FIG. 3.

Only the touch sensing unit 250 of the touch screen panel 200 is illustrated in FIG. 8. However, it is to be understood that various other components may also be provided.

The touch pads TPD are disposed along the second side 253 of the touch sensing unit 250. The touch flexible printed circuit board 400 and the touch sensing unit 250 may be electrically connected to each other through the touch pads TPD.

The reinforcement member PTL may be disposed between the second bending area BA2 and the touch sensing unit 250 in the first direction DR1. However, the present invention is not limited to this particular configuration. For example, the reinforcement member PTL may be disposed so as to partially overlap the second bending area BA2.

Figure 9:
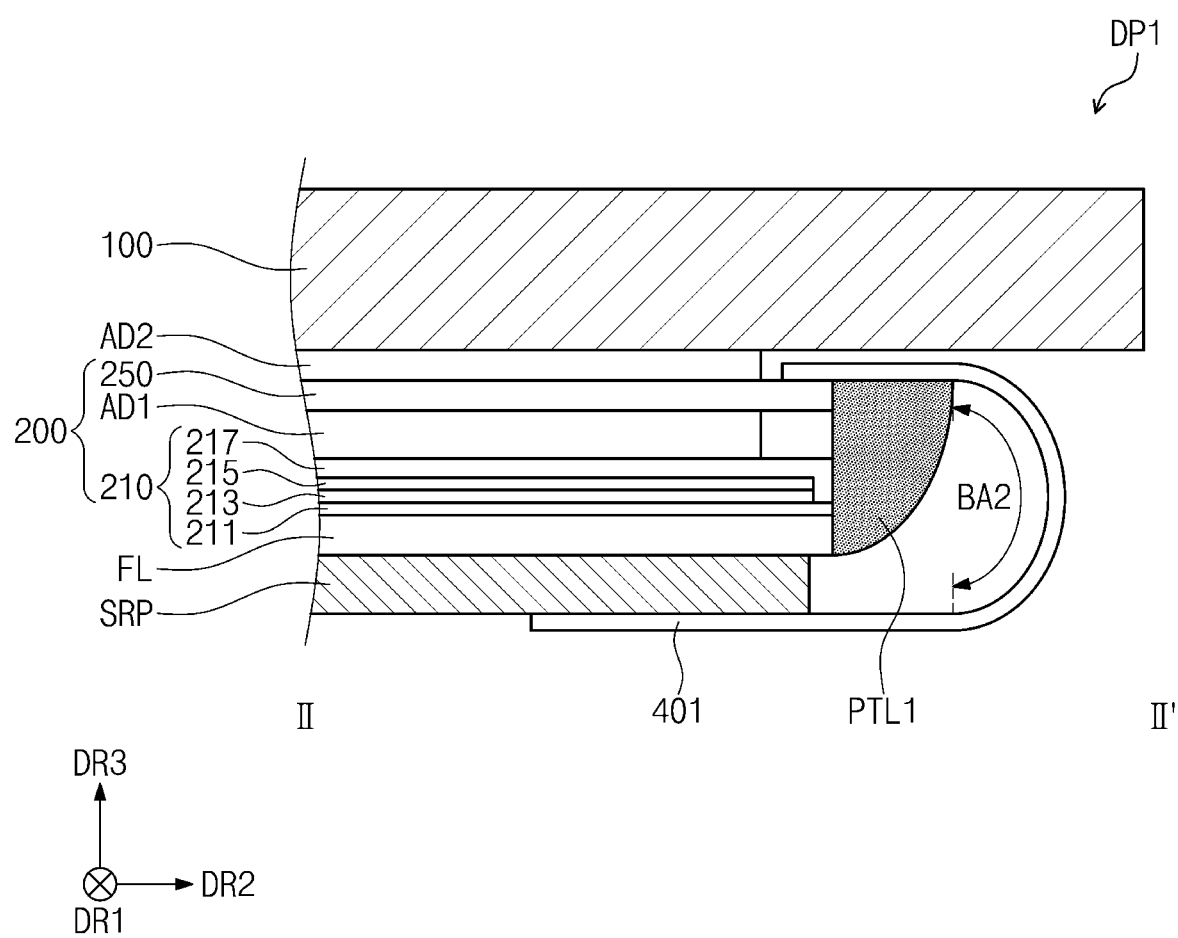
FIG. 9 is a cross-sectional view taken along line II-II' of FIG. 3, in a display apparatus according to an exemplary embodiment of the present inventive concept.

FIG. 9 is a cross-sectional view taken along line II-II' of FIG. 3, in a display apparatus according to an exemplary embodiment of the present inventive concept.

A display apparatus DP1 to be described with reference to FIG. 9 differs from the display apparatus DP described with reference to FIG. 7 in configurations of a touch flexible printed circuit board 401 and a reinforcement member PTL1, and to the extent that details concerning other elements are omitted, it may be assumed that the omitted elements are at least similar to corresponding elements that have already been described. Hereinafter, the difference between the display apparatus DP1 of FIG. 9 and the display apparatus DP of FIG. 7 will be mainly described.

The touch flexible printed circuit board 401 of the display apparatus DP1 may be attached to the upper surface of the touch sensing unit 250.

The reinforcement member PTL1 may be attached to a lower surface of the touch flexible printed circuit board 401, a side surface of the touch sensing unit 250, and a side surface of the display panel 210.

As the touch flexible printed circuit board 401 is attached to the upper surface of the touch sensing unit 250, the reinforcement member PTL1 is attached to the side surface of the touch sensing unit 250, so that the touch flexible printed circuit board 401 may be supported more firmly than in the configuration illustrated in FIG. 7. Therefore, the reinforcement member PTL1 may prevent cracks from occurring in the touch flexible printed circuit board 401.

Figure 10:
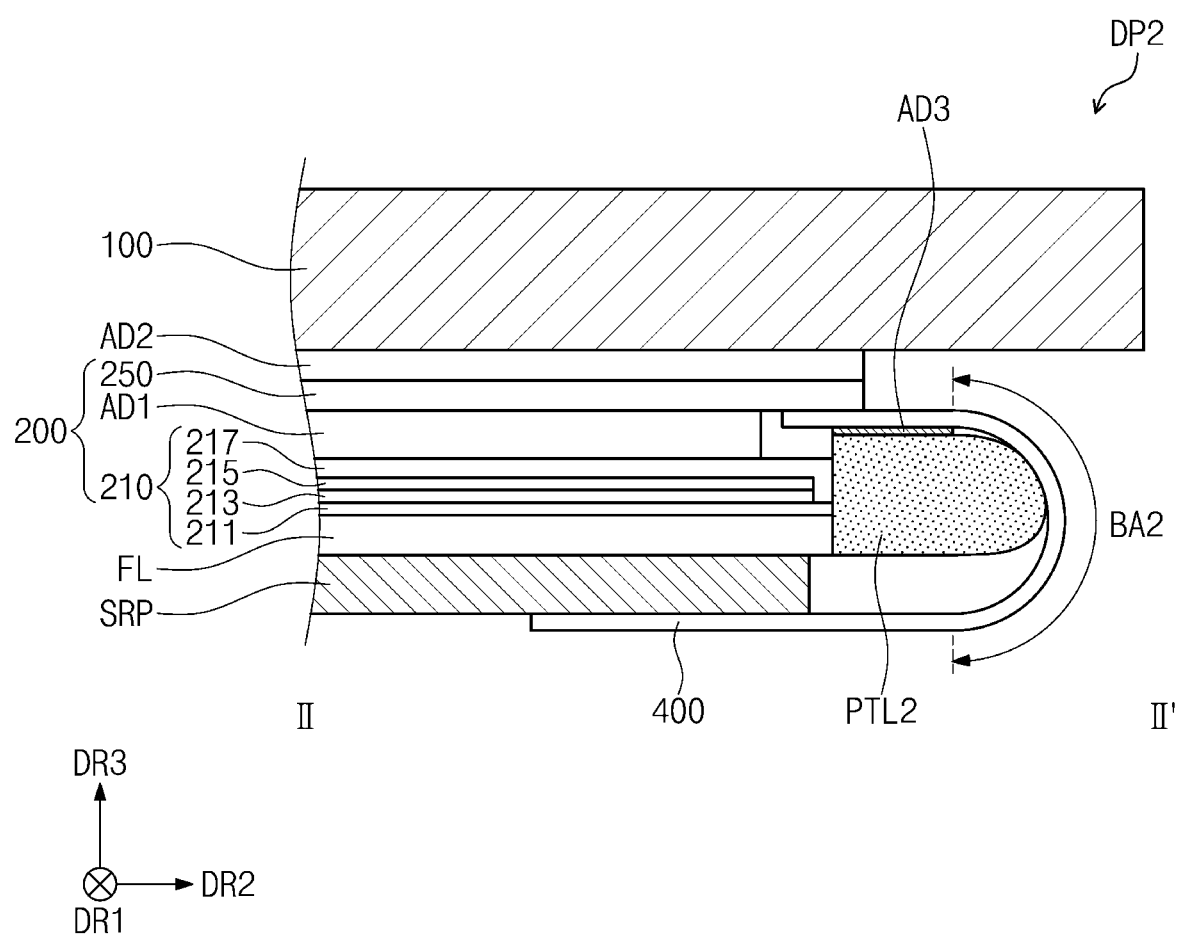
FIG. 10 is a cross-sectional view taken along line II-II' of FIG. 3, in a display apparatus according to an exemplary embodiment of the present inventive concept.

FIG. 10 is a cross-sectional view taken along line II-II' of FIG. 3, in a display apparatus according to an exemplary embodiment of the present inventive concept.

A display apparatus DP2 to be described with reference to FIG. 10 differs from the display apparatus described with reference to FIG. 7 in configuration of a reinforcement member PTL2, and to the extent that details concerning other elements are omitted, it may be assumed that the omitted elements are at least similar to corresponding elements that have already been described. Hereinafter, the difference between the display apparatus of FIG. 10 and the display apparatus of FIG. 7 will be mainly described.

The reinforcement member PTL2 of the display apparatus DP2 may be attached to a lower surface of the touch flexible printed circuit board 400 by a third adhesion layer AD3. The reinforcement member PTL2 may be in contact with a side surface of the display panel 210. In FIG. 10, the reinforcement member PTL2 is exemplarily illustrated as not being attached to the side surface of the display panel 210. However, the present invention is not limited to this particular configuration, and the reinforcement member PTL2 may be attached to the side surface of the display panel 210 through the adhesion layer. Further, the reinforcement member PTL2 may be attached to the lower surface of the touch flexible printed circuit board 400 or the side surface of the display panel 210.

The reinforcement member PTL2 may be made of a rubber or urethane-based material.

The reinforcement member PTL2 may be in contact with the touch flexible printed circuit board 400 in the second bending area BA2 to support the bending of the touch flexible printed circuit board 400. The reinforcement member PTL2 may prevent cracks from occurring in the touch flexible printed circuit board 400.

Figure 11:
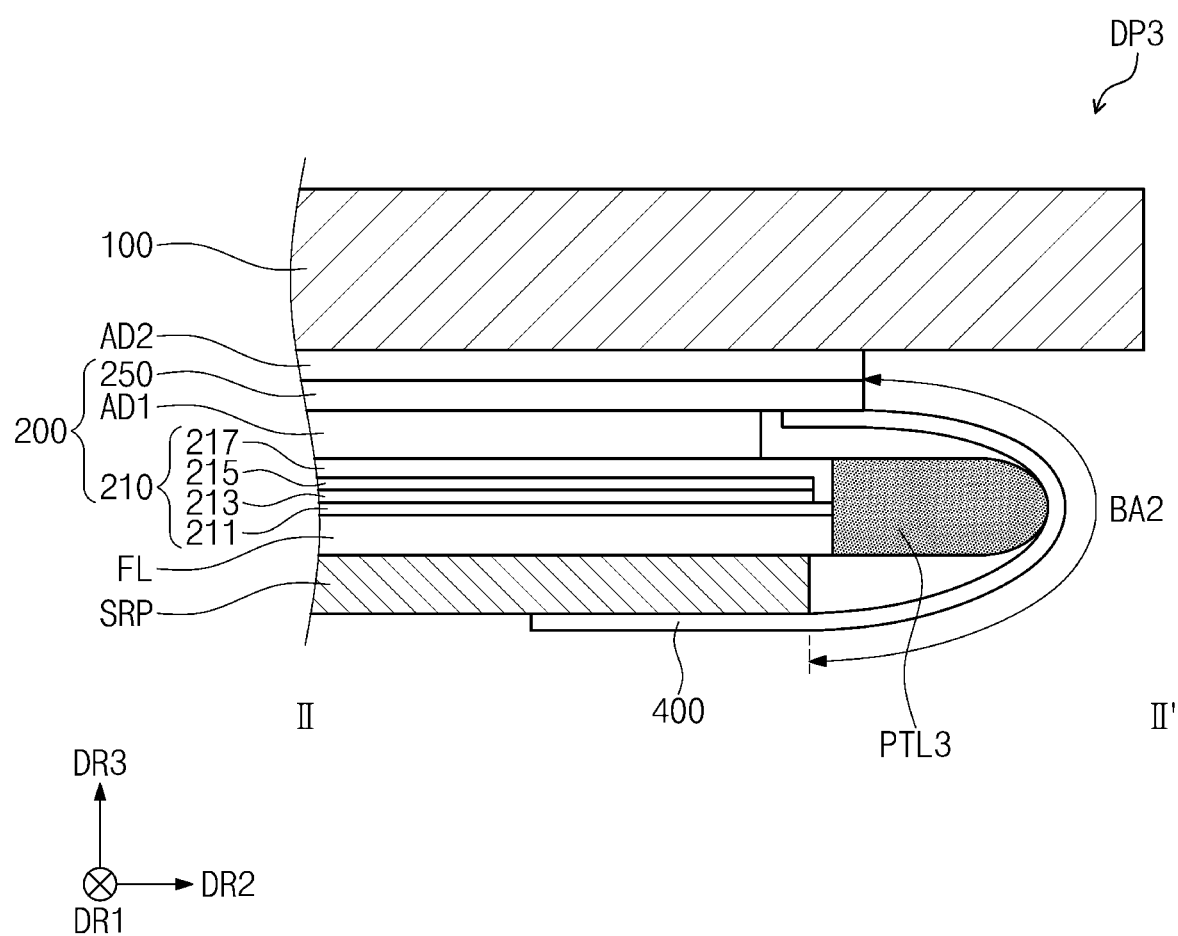

FIG. 11 is a cross-sectional view taken along line II-II' of FIG. 3, in a display apparatus according to an exemplary embodiment of the present inventive concept.

A display apparatus DP3 described with reference to FIG. 11 differs from the display apparatus DP described with reference to FIG. 7 in the configuration of a reinforcement member PTL3, and the remaining elements may be assumed to be substantially similar to corresponding elements described in detail above. Hereinafter, the difference between the display apparatus DP3 of FIG. 11 and the display apparatus DP of FIG. 7 will be mainly described.

The reinforcement member PTL3 of the display apparatus DP3 may be attached to a side surface of the display panel 210. One side of the reinforcement member PTL3 may have a substantially rounded shape. One side of the reinforcement member PTL3 may be in contact with the touch flexible printed circuit board 400 in the second bending area BA2 to support the bending of the touch flexible printed circuit board 400. The reinforcement member PTL3 may prevent cracks from occurring in the touch flexible printed circuit board 400.

In a display apparatus according to an exemplary embodiment of the present inventive concept, the radii of curvature of a display flexible printed circuit board and a touch flexible printed circuit board may be minimized, thereby reducing the size of the bezel of the display apparatus.

According to an exemplary embodiment of the present inventive concept, there is also provided a display apparatus having a reinforcement member attached on a lower surface of a touch flexible printed circuit board and a side surface of the touch screen panel, thereby preventing an adhesive portion of a touch flexible printed circuit board from cracking.

Although exemplary embodiments of the present invention have been described, it is understood that the present invention should not be limited to these exemplary embodiments but various changes and modifications can be made by one ordinary skilled in the art within the spirit and scope of the present invention.

What is claimed is:

1. A display apparatus, comprising:
   a touch screen panel having an active area and a non-active area defined thereon, the non-active area at least partially surrounding the active area, and the touch screen panel including a first side and a second side;
   a display flexible printed circuit board connected to the touch screen panel, the display flexible printed circuit board at least partially overlapping the first side of the touch screen panel;
   a touch flexible printed circuit board connected to the touch screen panel, the touch flexible printed circuit board at least partially overlapping the second side of the touch screen panel, and the touch flexible printed circuit board being bent toward a lower surface of the touch screen panel; and
   a reinforcement member being in contact with a lower surface of the touch flexible printed circuit board and a portion of a side surface of the touch screen panel connected to the second side of the touch screen panel.

2. The display apparatus of claim 1, wherein the touch screen panel, comprises:
   a display panel; and
   a touch sensing unit disposed on the display panel,
   wherein the display flexible printed circuit board is attached to an upper surface of the display panel, and
   wherein the touch flexible printed circuit board is attached to the touch sensing unit.

3. The display apparatus of claim 2,
   wherein the touch flexible printed circuit board is attached to a lower surface of the touch sensing unit, and
   wherein the reinforcement member is attached to both a side surface of the display panel and the lower surface of the touch flexible printed circuit board.

4. The display apparatus of claim 2, wherein the touch flexible printed circuit board is attached to an upper surface of the touch sensing unit, and wherein the reinforcement member is attached to both a side surface of the display panel and a side surface of the touch sensing unit.

5. The display apparatus of claim 2, wherein the reinforcement member comprises a curable material.

6. The display apparatus of claim 2, wherein the non-active area of the touch screen panel includes a first bending area extending in a direction parallel to the first side of the touch screen panel, wherein the first bending area is defined between the active area and the display flexible printed circuit board, and wherein the touch screen panel is bent in the first bending area.

7. The display apparatus of claim 6, wherein the touch screen panel further comprises a protective film disposed under the display panel, and wherein the protective film does not overlap the first bending area.

8. The display apparatus of claim 6, wherein the display panel comprises:
   a base substrate;
   a drive layer disposed on the base substrate, and including a plurality of signal lines and a transistor, an organic light emitting device layer configured to receive signals from the drive layer, and including an organic light emitting diode disposed within the active area;
   a stress compensation layer disposed on the drive layer and configured to at least partially cover the first bending area; and
   an encapsulation layer covering the organic light emitting device layer.

9. The display apparatus of claim 6, wherein the touch flexible printed circuit board includes a second bending area extending in a direction parallel to the second side of the touch screen panel, and wherein the touch flexible printed circuit board is bent in the second bending area.

10. The display apparatus of claim 9, wherein the touch screen comprises a first portion and a second portion separated from each other by the first bending area, and wherein the active area is defined within the first portion, and wherein the second portion of the touch screen panel at least partially overlaps the touch flexible printed circuit board in a state in which both the touch screen panel and the touch flexible printed circuit board are bent.

11. The display apparatus of claim 9, wherein the reinforcement member is attached to a lower surface of the touch flexible printed circuit board and/or a side surface of the display panel, and wherein the reinforcement member is in contact with the touch flexible printed circuit board in the second bending area.

12. The display apparatus of claim 11, wherein the reinforcement member includes a rubber or a urethane-based material.

13. The display apparatus of claim 9, wherein the reinforcement member is attached to a side surface of the display panel, and wherein one side of the reinforcement member has a substantially rounded shape and is in contact with the touch flexible printed circuit board in the second bending area.

14. The display apparatus of claim 2, wherein the touch flexible printed circuit board comprises a main portion and a plurality of branch portions, each of which protrudes from the main portion, wherein each of the plurality of branch portions is attached to the touch sensing unit, and each of the plurality of branch portions is spaced apart from neighboring branch portions of the plurality of branch portions.

15. The display apparatus of claim 14, wherein the plurality of branch portions includes a second bending area extending in a direction parallel to the second side, wherein each of the plurality of branch portions is bent in the second bending area.

16. The display apparatus of claim 1, further comprising a window member disposed on the touch screen panel, wherein the window member at least partially covers both of the display flexible printed circuit board and the touch flexible printed circuit board in a state in which the display flexible printed circuit board and the touch flexible printed circuit board are bent.

17. A display apparatus, comprising:
a display panel having a first side extending primarily in a first direction, the display panel having an active area and a non-active area defined thereon, the non-active are at least partially surrounds the active area, wherein the display panel is bent with respect to a first reference axis extending in the first direction;
a touch sensing unit disposed on the display panel and having a second side extending in a second direction crossing the first direction;
a display flexible printed circuit board connected to the display panel, the display flexible printed circuit board at least partially overlapping the first side of the display panel;
a touch flexible printed circuit board connected to the touch sensing unit, the touch flexible printed circuit board at least partially overlapping the second side of the touch sensing unit, and the touch flexible printed circuit board being bent with respect to a second reference axis extending in the second direction; and
a reinforcement member contacting both a lower surface of the touch flexible printed circuit board and a portion of a side surface of the display panel.

18. The display apparatus of claim 17, wherein the display panel comprises:
a base substrate;
a drive layer disposed on the base substrate, and including a plurality of signal lines and a transistor;
an organic light emitting device layer configured to receive signals from the drive layer, the organic light emitting device layer including an organic light emitting diode disposed in the active area; and
an encapsulation layer configured to at least partially cover the organic light emitting device layer, wherein the reinforcement member is attached to both the base substrate and the encapsulation layer.

19. The display apparatus of claim 17, wherein the display panel comprises at least one display pad disposed along the first side and connected to the display flexible printed circuit board, and wherein the touch sensing unit comprises at least one touch pad disposed along the second side and connected to the touch flexible printed circuit board.

20. The display apparatus of claim 17, wherein the touch flexible printed circuit board comprises a main portion and a plurality of branch portion, each of which protrudes from the main portion, wherein each of the plurality of branch portions is attached to the touch sensing unit, and each of the plurality of branch portions is spaced apart from neighboring branch portions of the plurality of branch portions, wherein the plurality of branch portions includes a second bending portion extending in a direction parallel to the second side, wherein each of the plurality of branch portions is bent in the second bending area.

* * * * *